United States Patent [19]

Yazaki

[11] Patent Number: 4,721,980
[45] Date of Patent: Jan. 26, 1988

[54] TRANSFER TYPE EACH-SIDE EXPOSURE APPARATUS

[75] Inventor: Yoshio Yazaki, Tokyo, Japan

[73] Assignee: ORC Manufacturing Co., Ltd., Chofu, Japan

[21] Appl. No.: 870,357

[22] Filed: Jun. 4, 1986

[30] Foreign Application Priority Data

Mar. 14, 1986 [JP]  Japan .................................. 61-56643

[51] Int. Cl.$^4$ ...................... G03B 27/32; G03B 27/52
[52] U.S. Cl. ........................................ 355/26; 355/30; 355/70
[58] Field of Search ...................... 355/23, 26, 30, 100, 355/110, 67, 70

[56] References Cited

U.S. PATENT DOCUMENTS 3,937,579  2/1976  Schmidt .............................. 355/304
4,095,881  6/1978  Maddox ................................ 355/30
4,565,443  1/1986  Yazaki ................................ 355/264

Primary Examiner—Richard A. Wintercorn
Attorney, Agent, or Firm—Cushman, Darby & Cushman

[57] ABSTRACT

Disclosed is a transfer type each-side exposure apparatus which comprises light sources which oppose each other and transfer means which transfer materials to be exposed between the light sources. In one aspect, the apparatus further comprises light shielding means which prevent the passage of the light rays for irradiation as required, and control means which controls the actuation of the light shielding means. In another aspect, the apparatus further comprises reflectors which consist each of a cold mirror. In still another aspect, the apparatus is such that the light sources are each disposed in a manner that a cathode constituting its light emitting portion is displaced by a small distance from one of focal points of a corresponding reflector provided in the light source.

7 Claims, 4 Drawing Figures

TRANSFER TYPE EACH-SIDE EXPOSURE APPARATUS

BACKGROUND OF THE INVENTION

1. Field of the Invention

The present invention relates to a transfer type each-side exposure apparatus which is arranged to transfer a plurality of materials desired to be exposed into an exposure chamber by transfer means to subject them to continuous exposure.

2. Description of the Prior Art

Various types of exposure apparatuses have hitherto been adopted in accordance with uses or purposes. When it is desired to effect a precise exposure baking, it is necessary to reproduce image lines of a document with high precision. To this end, it is desirable to use a point source of light as an exposure source of light so as to obtain paralle exposure light beams which are high in resolution. Actually, however, it is impossible to obtain a complete point source of light. Even if a light source nearly in the form of a point source of light is obtained, it is impossible to obtain an amount of light which is sufficient for performance of exposure. For this reason, a line source of light such as a high pressure mercury vapor lamp has hitherto been employed which enables a sufficient amount of light to be obtained although somewhat lengthy.

An exposure apparatus which uses a line source of light as the above-mentioned light source is disclosed in Japanese Patent Laid-Open No. 34162/85 previously filed in Japan by the Applicant of the present invention. The exposure apparatus disclosed in that literature has considerably improved the drawbacks which were produced with the use of a line source of light. When compared with the exposure baking performed with the use of the line source of light combined with a light beam control plate, the exposure baking performed with the use of the point source of light combined with a light beam control plate has a merit in that a high resolution is obtained with a simple construction but has a demerit, on the other hand, in that a large amount of exposure time is required for obtaining a sufficient amount of light necessary for exposure, resulting in a low productivity. The exposure apparatuses, with the use of which said exposure bakings are performed, each require the provision therein of transfer means for transferring material to be exposed, in order to make the irradiating amount of light uniform with respect to the materials to be exposed.

As stated above, the exposure apparatuses which use the point sources of light have a drawback in that they are low in productivity since they require the large amount of exposure time. A transfer type each-side exposure apparatus which is equipped with a plurality of light sources to effect exposure of each side of exposure material through one transfer thereof has been developed for purpose of eliminating said drawback. This exposure apparatus, however, also has problems to be solved.

Usually, in the transfer type each-side exposure apparatus, the size thereof is determined depending upon the irradiation area for permitting exposure to be made. Even when the irradiation area is made large, however, the apparatus per se is attempted to be minimized and thereby reduced in space therefor. For this reason, the exposure light sources are disposed at positions to vertically oppose each other with the exposure material located therebetween and to be substantially equally spaced from the exposure material. Whereby, those light sources are lit on a continuous basis. The exposure material is transferred into an exposure chamber and is moved through an exposure zone therein. For this reason, occasionally, the exposure material is discontinuous between the upper and lower light sources, so that the two light sources, while lit, oppose each other with nothing intervening in between. The light sources are provided with reflectors which optically form elliptic or parabolic faces, each reflector being disposed such that a light emitting portion of the corresponding light source is located on one focal point of the reflector. Therefore, when, as mentioned above, the light sources have been made directly to oppose each other while they are being lit, the light beams made parallel to each other by one reflector enter the other opposing reflector and are focussed onto a cathode constituting the light emitting portion of the light source having the other opposing reflector. As a result, the cathode, undesirably, is burnt or deteriorated.

SUMMARY OF THE INVENTION

Accordingly, the object of the present invention is to provide a transfer type eachside exposure apparatus which is capable of preventing its light emitting portions from being damaged or impaired due to mutual interference therebetween which may occur in the apparatus.

The above object can be achieved by providing the apparatus with light shielding means comprised of a light shielding plate and capable of preventing the mutual interference between the light sources, as well as control means for controlling the actuation of the light shielding means, or by using cold mirrors as the reflectors, or by using the light sources each of which is disposed such that the cathode constituting its light emitting portion is located at a position slightly displaced from the focal point of the corresponding reflector.

By using the above-mentioned three alternative means, the mutual interference between the light sources can be prevented. That is, first of all, when the material to be exposed has discontinued between the upper and lower light sources, this discontinuity is detected and the light shielding plate is caused to intervene between both the light sources to thereby prevent the light emitted from one of the two light sources, from entering the other thereof to interfere therewith. Secondly, the mutual interference between the light sources can be prevented by using the reflectors consisting of cold mirrors capable of reflecting only the light rays having a specified range of wavelengths necessary for exposure and of transmitting therethrough the light rays having the remaining range of wavelengths, the light rays in particular such as infrared rays or visible rays which have wavelengths at which the light rays contain large amounts of heat components. And thirdly, the cathode constituting the light emitting portion of each light source is disposed at a position displaced from one focal point of the corresponding reflector, whereby the focal point onto which the light beams emitted from one light source are focussed is located at a position other than that at which the cathode constituting the light emitting portion of the other light source is located. Thus, it is possible to prevent the damage or impairment of the light emitting cathodes due to mutual interference between the light sources involved.

DESCRIPTION OF THE PREFERRED EMBODIMENTS

Figure 1:
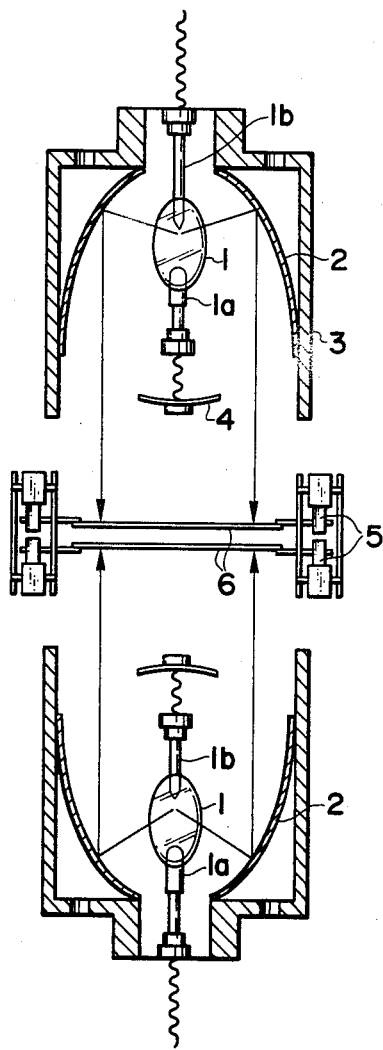
FIG. 1 is a side sectional view of an essential portion of a transfer type each-side exposure apparatus.

The present invention will now be described in detail in accordance with embodiments illustrated in the drawings.

Figure 2:
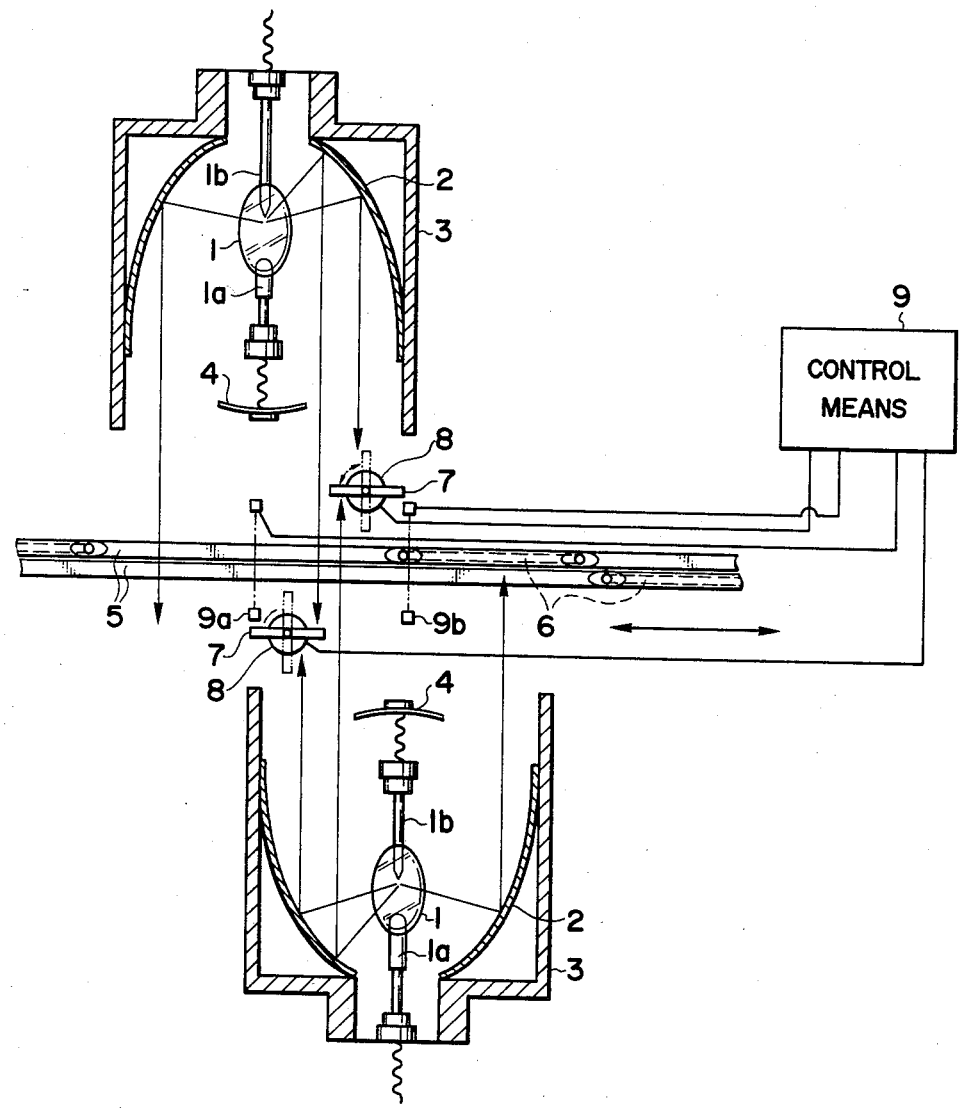
FIG. 2 is a front sectional view of the essential portion of the apparatus using light shielding plates.
Figure 3:
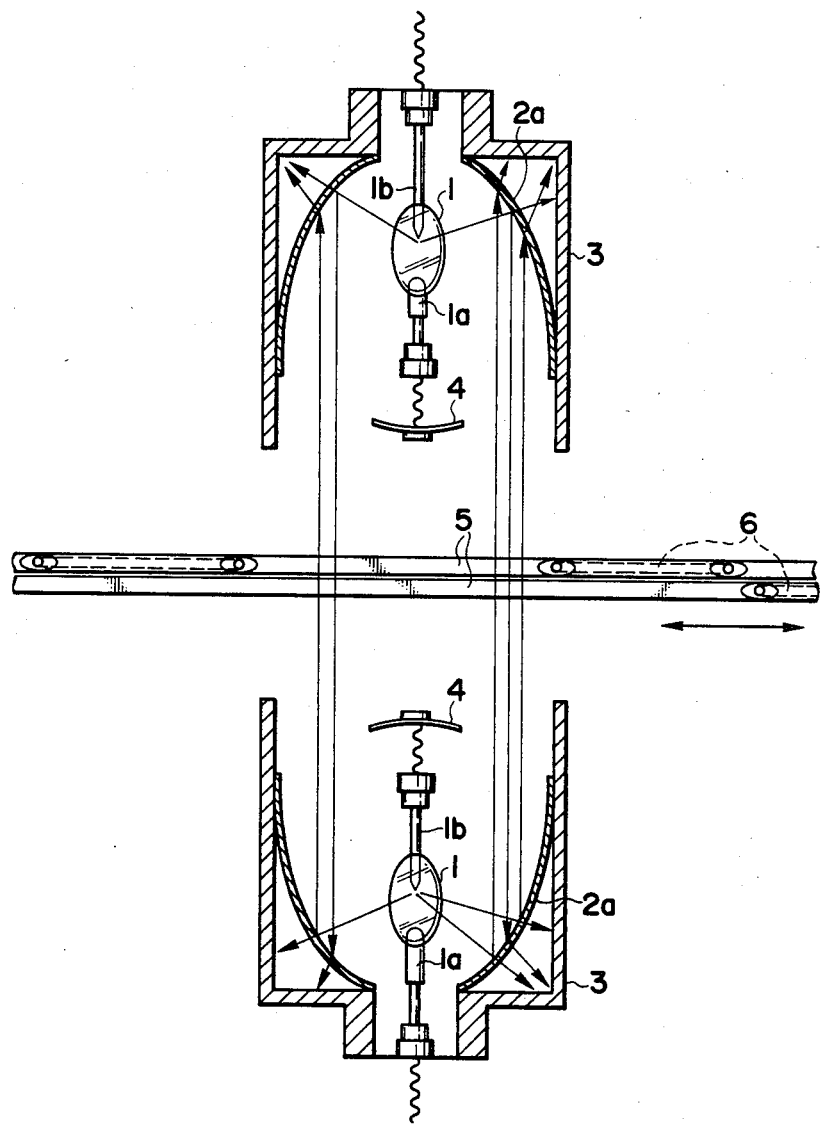
FIG 3 is a front sectional view of the essential portion of the apparatus using cold mirrors; and, FIG. 4 is a front sectional view of the essential portion of the apparatus using light sources whose light emitting portions are displaced.
Figure 4:
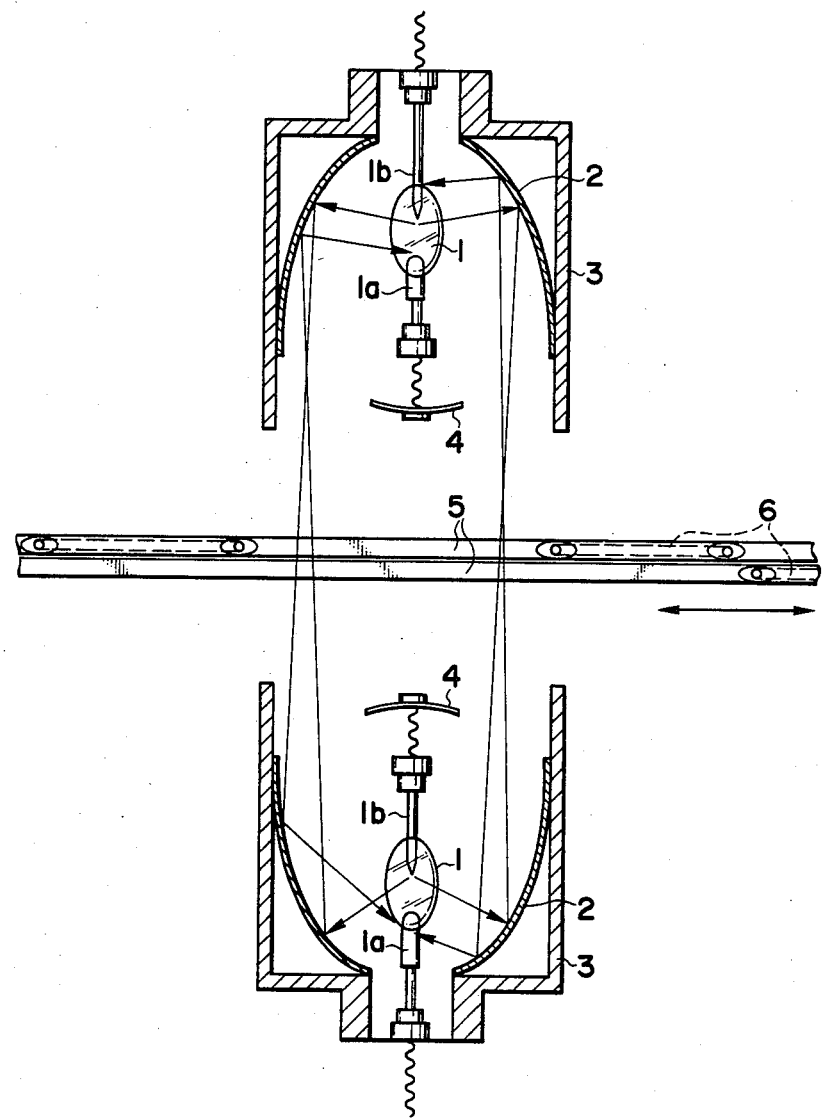

FIG. 1 is a side sectional view showing an essential part of the transfer type each-side exposure apparatus. FIGS. 2, 3 and 4 are front sectional views showing the essential parts of the exposure apparatus. A point source of light 1 emits lights through the occurrence of electric discharge between its anode 1a and a cathode 1b. The reference numeral 2 denotes a reflector which forms an elliptic or parabolic face to reflect those lights. The point source of light 1 and the reflector 2 are received within a lamp house 3. The reference numeral 4 denotes a light beam control plate which is provided for restricting the light beams irradiated onto a material desired to be exposed, only to the parallel light beams. The reference numeral 5 denotes a transfer means and the reference numeral 6 the material desired to be exposed.

FIG. 2 shows a transfer type each-side exposure apparatus according to a first embodiment of the invention. In FIG. 2, the transfer means 5, 5 of two independent systems are transferring the exposure materials between the upper and lower point sources of light 1, 1 so as to effect continuous exposure. FIG. 2 illustrates a state wherein, during the continuous exposure, some interval is produced between the exposure materials 6 with the result that the upper and lower light sources 1, 1 oppose each other with nothing intervening in between. In this exposure apparatus, the light sources 1, 1 are disposed such that they are displaced from each other by the radius of the reflector 2 or 2. This is for the purpose of minimizing the duplication of irradiation zones, in the transfer means 5, 5, of the upper and lower light sources 1, 1 as far as the size of the exposure apparatus permits so as to minimize the mutual interference between both the light sources 1, 1. The exposure materials 6 which are mounted on exposure bases of the transfer means 5, 5 and are transferred are monitored by sensors 9a, 9b of control means 9 to detect whether or not the exposure material 6 is present in the duplicated zone of the irradiation zones in the transfer means 5, 5. When no exposure material is present between the sensors 9a and 9b to have a blank created therebetween, detection signals from the sensors 9a, 9b are transmitted to the control means 9 to thereby drive rotary solenoids 8, 8 or the like directly connected to light shielding plates 7, 7. Whereby, the light shielding plates 7, 7 normally made parallel to the irradiation light rays to permit the transmission of these rays are rotated up to the positions at which they are perpendicular to those rays. The light shielding plates 7, 7 thus serve to shield the irradiation light rays to thereby prevent the direct mutual irradiation between the upper and lower light sources 1, 1.

In this first embodiment, the light shielding plates 7, 7 having a length slightly larger than ½ of the length of the duplicated irradiation-zone portion are disposed, two in number, at the irradiation light outlets of the upper and lower light sources 1, 1, respectively. However, one light shielding plate 7 having a length larger than that of said duplicated irradiation-zone portion may be disposed one in number at the same place, or the light shielding plates 7, 7 may be disposed in a multistage fashion at each irradiation light outlet. Further, in this first embodiment, the upper and lower light sources 1, 1 are disposed such that one of them is horizontally displaced from the other. In this case, the distance by which said one of them is horizontally displaced from the other may be shorter and the light shielding plates 7, 7 may have a length which is larger by that extent. Further, the light shielding plates 7, 7 may also be of course applied in a state wherein the upper and lower light sources 1, 1 oppose each other completely vertically.

FIG. 3 shows a transfer type each-side exposure apparatus according to a second embodiment of the invention. In FIG. 3, there is shown a state wherein the upper and lower light sources 1, 1 directly oppose each other while they are lit for exposure. This second embodiment shown in FIG. 3 differs from the preceding first embodiment in that in the former, the upper and lower light sources 1, 1 vertically oppose each other and cold mirrors are used for the reflectors 2a, 2a. The action of this second embodiment having said construction will now be described. The light rays emitted from the mutually opposing light sources 1 or 1 are made parallel by the corresponding reflector 2a or 2a consisting of a cold mirror. At this time, the reflector 2a or 2a transmits therethrough a large part of the light rays other than those having a specified range of wavelengths necessary for exposure, particularly the light rays such as infrared rays which have wavelengths permitting the corresponding light rays to contain large amounts of heat components, and which are therefore likely to burn, by entering the opposing light source 1 or 1, the cathode 1b or 1b constituting the light emitting portion of that opposing light source 1 or 1 to damage or impair the same. The remaining said light rays which are reflected by the reflector 2a or 2a to enter the opposing light source 1 are transmitted by the corresponding reflector consisting of a cold mirror, so that they are stopped from reaching the light emitting portion of said opposing light source 1.

The cold mirrors 2a employed in this second embodiment have the capability of transmitting therethrough the light rays of the wavelengths permitting, for example, heat components to be present in the light rays. However, it is possible, and matter-of-course, to change the effective light components to be reflected, in accordance with the quality of the exposure material.

FIG. 4 shows a transfer type each-side exposure apparatus according to a third embodiment of the invention. In this third embodiment, the upper and lower light sources 1, 1 vertically oppose each other and each light source 1 is disposed in a manner that it is displaced by a small distance from a corresponding one of focal points of the corresponding reflector 2 forming an elliptic or parabolic face. More specifically, while the light source 1 is comprised of the anode 1a and the cathode 1b, this cathode 1b constituting the light emitting portion of the light source 1 is displaced by such a small distance from a corresponding one of the focal points of the corresponding reflector 2. This is for the purpose of causing said corresponding one of the focal points to be located at a position other than the position of that cathode 1b. The action of this third embodiment will now be described. When the two opposing light sources 1, 1 have directly opposed each other while they are lit for exposure, the light rays emitted from each light source 1 or 1 are incident upon the reflectors 2, 2 and are focussed on the focal points thereof. However, since any one of the light emitting cathodes 1b is not located at the corresponding focal point, it is impossible that the cathode 1b is burned to damages by the action of the heat contained in the light rays focussed on said corresponding focal point. On the other hand, since the light emitting portion is not located at the corresponding focal point, the exposure, which requires the use of parallel light rays, is made by the light rays containing a small amount of oblique light rays. Such exposure, however, does not undesirably affect the quality of the product.

The invention is not limited to the above-mentioned embodiments but permits various modifications to be made. For instance, in the above-mentioned embodiments, the light sources 1, 1 are disposed in such a manner as to vertically oppose each other. In this case, however, the transfer means 5, 5 can be disposed not in a manner that one of them is vertically superposed upon the other but in a manner that they are located, respectively, at the right and left sides of the lamp house 3. Under this disposition of the transfer means 5, 5, the light rays from the upper and lower light sources 1, 1 are reflected with the use of plane mirrors. If in this arrangement, exposure can be made while the exposure materials are transferred on the right and left sides of the lamp house. Further, the light sources employed in the invention are not limited to the point source of light. The invention permits the use of light sources of other shapes.

As will be understood from the foregoing description, in the transfer type eachside exposure apparatus, the light sources can be prevented from being damaged or impaired due to mutual interference therebetween, by use of the following means. First of all, by the means of the invention wherein use is made of the light shielding plates for shielding the light rays only at the time when mutual irradiation occurs between the light sources. Secondly, by the means of the invention wherein the reflectors disposed in the light sources are each comprised of a cold mirror. And thirdly, by the means of the invention wherein the cathodes constituting the light emitting portions of the light sources are disposed such that they are displaced from the focal points of the reflectors by small distances affecting the exposure precision only to a small degree.

By adopting the above-mentioned three means of the invention intended for preventing the damages or impairment of the light sources due to mutual direct irradiation therebetween, the following three effects are obtained. Firstly, the transfer type each-side exposure apparatus becomes high in productivity. Secondly, miniaturization of the apparatus as well as reduction in the space required therefor is achieved. And thirdly, the apparatus becomes high in respect of reliability.

What is claimed is:

1. A transfer type each-side exposure apparatus comprising light sources which oppose each other, transfer means which are intended to transfer materials to be exposed between said light sources, light shielding means which are intended to permit the light rays from said light sources to pass for irradiation or to prevent the passage of said light rays for irradiation of said materials to be exposed, and control means which controls said light shielding means so that said light shielding means may permit the passage of said light rays when exposure is made of said materials to be exposed and so that said light shielding means may prevent the passage of said light rays when no exposure is made of said materials to be exposed.

2. A transfer type each-side exposure apparatus comprising:
first and second reflector means each including a concavely curved surface directed toward a material to be exposed, said reflector means being mounted such that said concavely curved surfaces are in opposition to one another, said concavely curved surfaces of said reflectors including a cold mirror;
first and second spot-like light sources mounted in opposition to one another, each light source being mounted so as to be disposed between a said reflector means and the respective side of the material to be exposed; and
transfer means for transferring materials to be exposed between said first and second light sources.

3. A transfer type each-side exposure apparatus comprising:
first and second reflector means each including a concavely curved surface directed toward a material to be exposed, said reflector means being mounted such that said concavely curved surfaces are in opposition to one another, said concavely curved surfaces of said reflectors including a cold mirror;
first and second spot-like light sources mounted in opposition to one another, each light source being mounted so as to be disposed between a said reflector means and the respective side of the material to be exposed, each said light source including a cathode means defining a light emitting portion thereof, each said light source being disposed such that its respective cathode is displaced by a predetermined distance from a focal point of a respective concavely curved surface; and
transfer means for transferring materials to be exposed between said first and second light sources;

4. A transfer type each-side exposure apparatus as in claim 2, wherein each said concavely curved surface is curved in a semicircular configuration.

5. A transfer type each-side exposure apparatus as in claim 3, wherein each said concavely curved surface is curved in a semicircular configuration.

6. A transfer type each-side exposure apparatus as in claim 2, wherein each said concavely curved surface is curved in a parabolic configuration.

7. A transfer type each-side exposure apparatus as in claims 3, wherein each said reflector means concavely curved surface is curved in a parabolic configuration.

* * * * *